United States Patent [19]
Brenneman et al.

[11] 3,936,704
[45] Feb. 3, 1976

[54] MOUNTING ARRANGEMENT FOR ELECTRONIC SEMI-CONDUCTOR DEVICES

[75] Inventors: Daniel Andrew Brenneman, Kettering; Ramon Wright Ragan, Dayton; Thomas Harry Brockie, West Carrollton, all of Ohio

[73] Assignee: Chrysler Corporation, Highland Park, Mich.

[22] Filed: Nov. 18, 1974

[21] Appl. No.: 524,601

[52] U.S. Cl. .................. 317/118; 317/100; 357/75
[51] Int. Cl.² .................. H01L 23/12; H01L 23/40
[58] Field of Search .................. 317/99, 100, 118; 310/68 D; 321/8 C; 174/52 R, DIG. 5; 357/75, 76, 79, 74

[56] References Cited
UNITED STATES PATENTS

| | | | |
|---|---|---|---|
| 3,471,757 | 10/1969 | Sias | 357/79 |
| 3,523,215 | 8/1970 | Steinmetz, Jr. | 317/100 |
| 3,551,758 | 12/1970 | Ferree | 357/79 |
| 3,619,473 | 11/1971 | Meyerhoff | 174/DIG. 5 |
| 3,686,540 | 8/1972 | Furnival | 357/79 |
| 3,786,168 | 1/1974 | Jaecklin | 174/DIG. 5 |

*Primary Examiner*—Gerald P. Tolin
*Attorney, Agent, or Firm*—Talburtt & Baldwin

[57] ABSTRACT

Each of a pair of electronic semi-conductor switching devices is disposed between a corresponding pair of conductor plates. The semi-conductor devices are aligned with each other, and the complete assemblage is held together by means of a clamp which applies a clamping force to tightly hold each semi-conductor device between its corresponding pair of conductor plates. A spacer arrangement separates the two pairs of plates and includes a spherical pivot bearing seated between a pair of individual spacer plates which are in turn separated from the immediately adjacent conductor plates by means of annual insulating spacers. The pivot bearing permits limited pivotal movement of one pair of plates relative to the other so that excellent surface contact between each semi-conductor device and its corresponding pair of conductor plates is maintained when one plate of each pair is attached to a corresponding electrical terminal fixedly mounted on a control panel into which the assemblage mounts. By permitting such limited movement, a mounting arrangement embodying the invention can tolerate some misalignment between the terminals while still achieving excellent conductivity between each terminal and the conductor plate to which it attaches as well as between each semi-conductor device and its plates.

14 Claims, 4 Drawing Figures

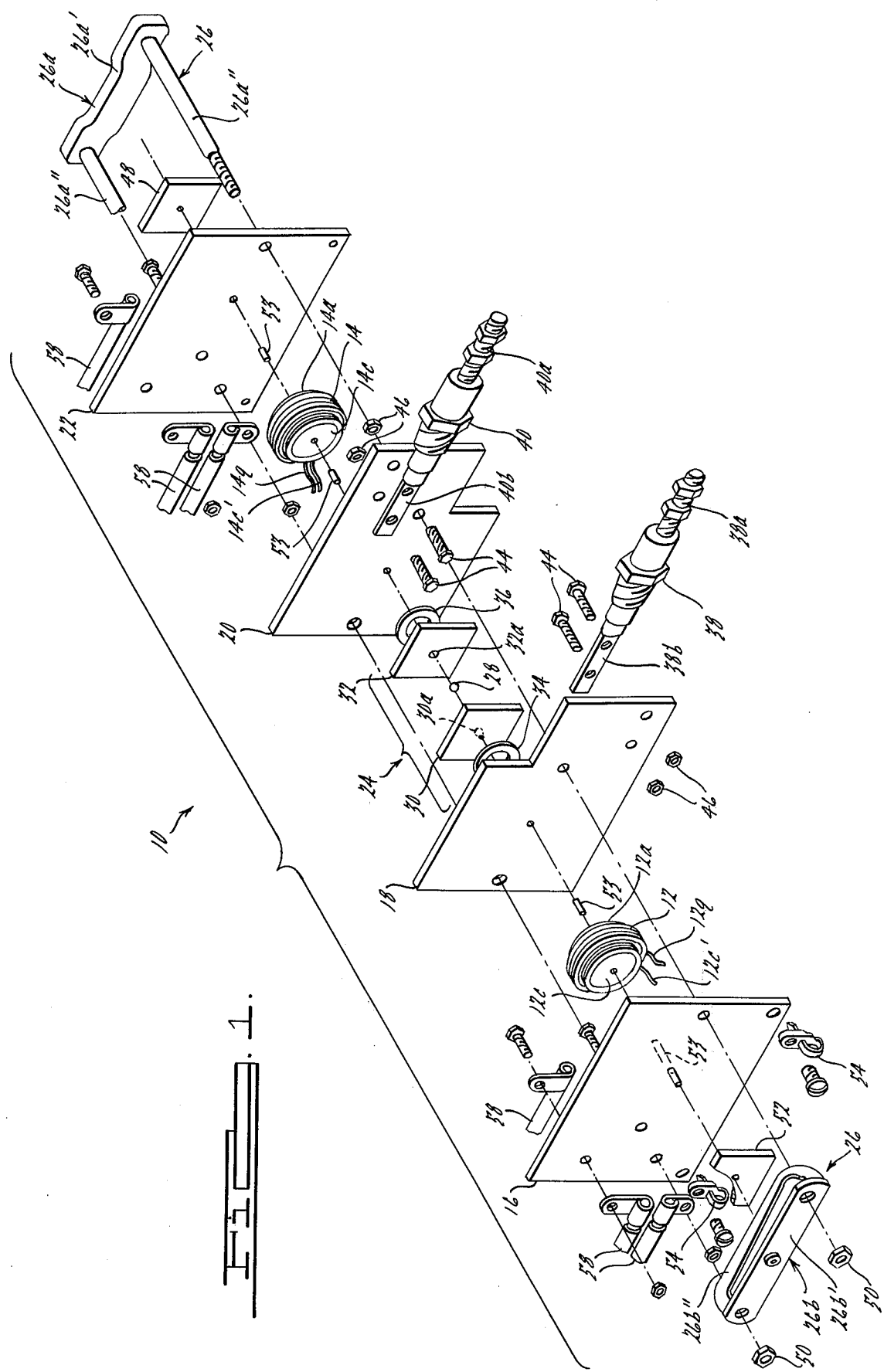

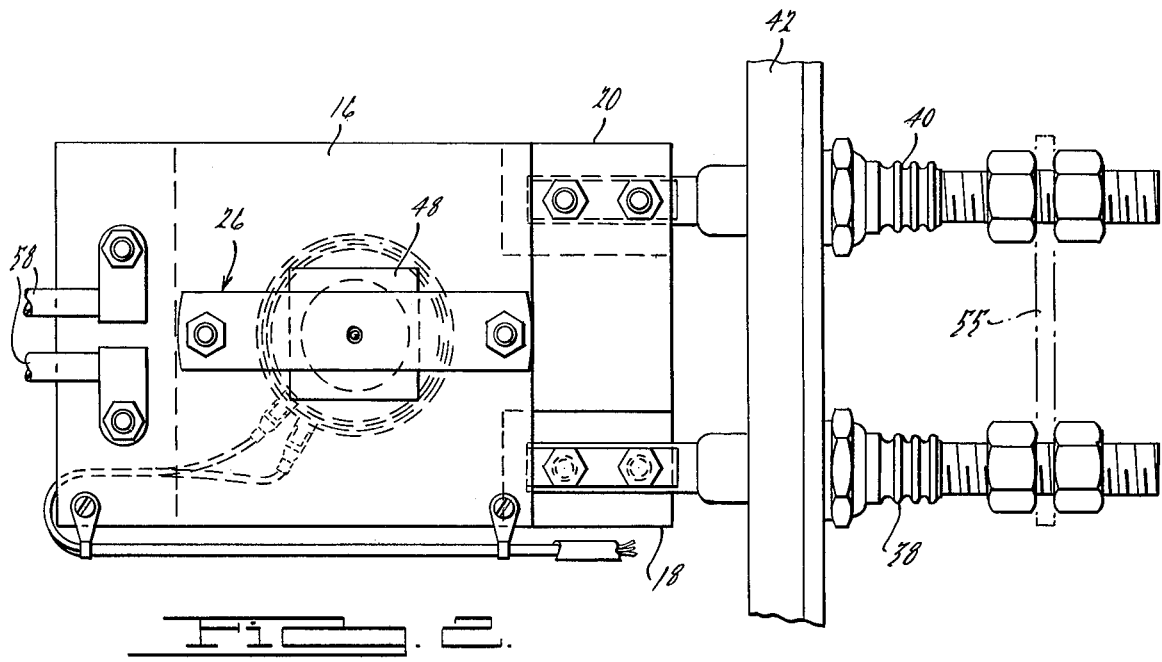
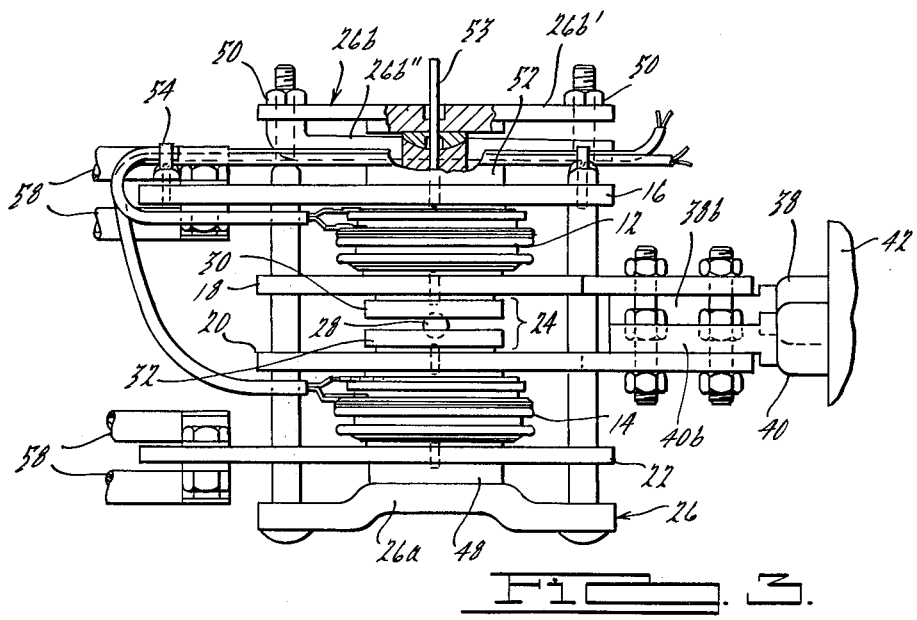

MOUNTING ARRANGEMENT FOR ELECTRONIC SEMI-CONDUCTOR DEVICES

BACKGROUND AND SUMMARY OF THE INVENTION

The present invention pertains to mounting arrangements for electronic semi-conductor devices and in particular to a novel arrangement for mounting semi-conductor devices in pairs in a control panel to effect electrical connection of each semi-conductor device with an electrical terminal fixedly mounted on the panel.

Currently available electronic semi-conductor devices are packaged in various ways. In one such package the semi-conductor structure is contained within a housing shaped in the form of a circular disc. The ends of the disc are flat circular surfaces which form the principal external electrical terminals for the semi-conductor device. Other terminals in the form of small wire leads may emanate from the device for the purpose of conducting a triggering signal to the semi-conductor to initiate conduction thereof with main current flow being through the device between the flat circular end surfaces thereof. Generally, semi-conductor devices of this type carry an appreciable amount of current. There are presently various possible ways of mounting such devices in order to effect electrical connection to the flat circular end terminal surfaces thereof. One way is by clamping the device between a pair of conductor plates thereby promoting good surface contact between each plate and the corresponding end surface of the device whereby ohmic losses at the mating surfaces are minimized and heat transfer from the device to the conducting plates is promoted. While this mounting arrangement may be acceptable where a single semi-conductor device is to be mounted; it has been observed that satisfactory contact between conductor plates and semi-conductor devices cannot always necessarily be obtained when a number of semi-conductor devices and plates are stacked together and clamped. Illustrative arrangements for mounting semi-conductor devices are shown in prior U.S. Pat. Nos. 2,781,480, 3,333,163, 3,356,914 and 3,447,118.

The present invention is directed toward a novel mounting arrangement for electronic semi-conductor devices in which an improved surface contact between semi-conductor devices and conductor plates is obtained where a plurality of semi-conductors and plates are to be stacked together. Accordingly, the present invention yields a mounting arrangement having improved thermal and electrical conductivity between the semi-conductor devices and mounting plates thereby minimizing ohmic losses and better protecting the semi-conductor device from potentially damaging thermal build-up. This improvement is particularly important for solid state devices having large current ratings although the invention also is useful with devices having lesser ratings.

The present invention also provides an improved mounting arrangement wherein a number of semi-conductor devices are to be stacked together each between a pair of plates and the stack attached to fixed terminals mounted on a control cabinet. In an installation of this type, the present invention compensates for a certain mount of misalignment between the terminals so as to permit a good electrical contact to be made between the terminals and the plates of the stack while at the same time maintaining good contact between the semi-conductor devices and the plates. Moreover, the invention possesses economy and facility in construction and assembly.

The foregoing features and advantages, as well as additional ones, will be seen in the ensuing description and claims which are to be taken in conjunction with the accompanying drawings. The drawings illustrate a preferred embodiment according to the best mode presently contemplated in carrying out the invention.

BRIEF DESCRIPTION OF THE DRAWINGS

FIG. 1 is an exploded perspective view of the improved electronic semi-conductor mounting arrangement according to the present invention.

FIG. 2 is a front plan view of the improved mounting arrangement of FIG. 1 as assembled.

FIG. 3 is a bottom view of FIG. 2.

FIG. 4 is an electrical schematic diagram of the arrangement of the preceding figures.

DESCRIPTION OF THE PREFERRED EMBODIMENT

FIGS. 1, 2 and 3 illustrate the improved mounting arrangement 10 according to the present invention for mounting a pair of electronic semi-conductor devices 12 and 14, illustratively disclosed as silicon controlled rectifiers (SCR's) each having a cathode terminal, an anode terminal and a gate terminal. Semi-conductor device 12 is disposed between a pair of conductor plates 16, 18 and device 14 between a second pair of conductor plates 20 and 22. A spacer arrangement 24 separate the two pairs of plates, and a clamp assembly 26 clamps the foregoing assemblage of components together. Each device 12 and 14 is in the form of a circular disc, and the flat circular end surfaces of each disc are the anode and cathode terminals. Surface 12c designates the cathode of device 12 and surface 12a, the anode; similarly surface 14c, the cathode of devices 14 and surface 14a, the anode. The clamping force applied by clamp 26 will tend to press the flat circular terminal surfaces 12a, 12c, 14a, 14c against the flat surfaces of the corresponding conductor plates.

Pursuant to principles of the present invention, spacer arrangement 24 permits limited pivotal displacement between the two pairs of conductor plates. This way more intimate surface contact is obtained between the semi-conductor devices and their respective mounting plates to thereby minimize ohmic loss at the mating services and to promote heat transfer from the semi-conductor devices to the conducting plates. The illustrated construction of the preferred spacer arrangement 24 includes a spherical pivot bearing 28, a pair of flat square spacer plates 30 and 32 and a pair of annular circular insulators 34 and 36. The surfaces of spacer plates 30 and 32 which face each other are centrally provided with spherically contoured seats, 30a and 32a respectively and pivot bearing 28 is seated therebetween. It will be noted that the maximum depth of each of the two seats is preferably somewhat less than the radius of pivot bearing 28 so that adequate clearance is provided between the two spacer plates. Insulator 34 is disposed between conductor plate 18 and spacer plate 30 while insulator 36 is disposed between spacer plate 32 and conductor plate 20. The two semi-conductor devices 12 and 14, the two spacer plates 30 and 32, the two insulators 34, 36 and pivot bearing 28 are axially aligned with each other. The conductor plates are preferably brass.

Mounting arrangement 10 is especially beneficial where each of the semi-conductor devices is to be electrically connected via one of its conductor plates to an electrical terminal fixedly mounted in a control panel in which the assemblage mounts. The drawings disclose an exemplary arrangement wherein a pair of electrical terminals 38 and 40 are fixedly mounted on the wall 42 of a control panel in which the semi-conductor mounting arrangement is located. By way of illustration, terminals 38 and 40 may be of the type commonly known as feed-through terminals which are threaded into suitable openings in wall 42. Current carrying conductor cables (not shown) attach to the portions 38a, 40a respectively of terminals 38 and 40 which are exterior of wall 42 while the interior portions 38b, 40b of the terminals attach to the mounting arrangement, terminal 38 attaching to conductor plate 18 and terminal 40 to conductor plate 20. The terminals are most readily oriented with their axes generally parallel and of a design which is insulated from and sealed with respect to wall 42 to conduct current from the exterior conductor cables to the semi-conductor devices 12 and 14. A terminal of this type is manufactured by Auburn Spark Plug Co.

Since it is desirable that terminals 38 and 40 be securely attached to and sealed with respect to wall 42, it is customary to mount the terminals on the wall before the semi-conductor devices and their mounting arrangement are attached to the terminals. When the screws 44 and nuts 46 which are used to attach the terminals to their respective conductor plates are installed and tightened, the conductor plates and the terminals will tend to be drawn tightly against each other. However, because of dimensional tolerances, or other reasons, there is usually some misalignment between the terminals and the conductor plates to which they are to attach when the semi-conductor mounting arrangement is first positioned within the control cabinet for mounting. Thus, the tightening of screws 44 and 46 would, absent the pivotal movement provided by spacer arrangement 24, create undesirable stresses and deformations in the overall structure when such tightening occurs since clamp assembly 26 is already tightly clamping the semi-conductor devices between the conductor plates. Such stresses and deformations can seriously impair the surface contact between the semi-conductor devices and their conductor plates and between the conductor plates and terminals. With the present invention, such stresses and deformations are minimized upon tightening so that good surface contact between each terminal and its corresponding conductor plate is obtained while good surface contact between each semiconductor device and its respective pair of conductor plates is simultaneously maintained. Hence, with the present invention electric current is more efficiently conducted from each terminal to and through its corresponding semi-conductor device, and heat is more efficiently transferred to the conductor plates for subsequent dissipation to the surrounding medium.

As best seen in FIG. 3, the preferred disclosed embodiment is dimensioned so that the spacing between conductor plates 18 and 20 is greater than the width of the flattened interior portions 38b, 40b of each terminal. Because neither terminal is in contact with both conductor plates 18 and 20, it would be possible for current to flow through spacer arrangement 24 if a voltage potential difference exists between the two plates. By providing insulators 34, 36 the spacer arrangement is electrically insulated from the two conductor plates thereby precluding the possibility of current flow through the spacer arrangement between the two plates. Apart from the insulating characteristics of insulators 34 and 36, the sizing of same to approximately the same size as the end terminals of semi-conductors 12 and 14 is believed beneficial for surface contact between the semi-conductor device and the conductor plates.

The specific type of clamp assembly 26 is desirable in that it provides a convenient adjustment for obtaining the desired clamping force while more uniformly applying same to the stack. Specifically, clamp assembly 26 comprises a stud bar 26a having a rigid cross bar 26a' from whose ends project a pair of projecting studs 26a'' which pass through suitable openings in the four conductor plates 16, 18, 20 and 22. A spacer plate 48 is disposed between cross bar 26a' and conductor plate 22. With the conductor plates, the spacer arrangement and semi-conductor devices having been stacked onto stud bar 26a, a clamping bar arrangement 26b forming another part of the clamp assembly is assembled onto the projecting threaded ends of the studs and is secured thereon by means of nuts 50. A spacer plate 52 is disposed between clamping bar arrangement 26b and conductor plate 16. The clamping bar arrangement 26b contains a rigid bar 26b' at one end of which is cantilevered a spring leaf 26b''. A swivel support is provided between the two as shown at the broken away section of FIG. 3. This provides good clamping action as nuts 50 are tightened to draw the components of the mounting arrangement together. If desired, alignment pins 53 may be used to assist in locating the components for assembly.

Insulated lead wires 12g and 12c' emanate from semi-conductor 12 and lead wires 14g and 14c' from semi-conductor 14. Leads 12g and 14g connect to the gate terminal of the corresponding semi-conductor and leads 12c' and 14c' to the corresponding cathode terminal. The lead wires are retained by means of clips 54 and may be routed out of the control panel via small feed-through terminals similar to terminals 38 and 40. A triggering signal is supplied via each pair of lead wires to initiate conduction of the corresponding semi-conductor device.

FIG. 4 illustrates an electrical schematic diagram of the semi-conductor and mounting arrangement of the preceding figures wherein like items are similarly numbered. An exemplary use of the present invention is in each of the three phases of a three-phase line which connects a three-phase source to a three-phase load. Anode 12a and cathode 14c would be connected to the line side while cathode 12c and anode 14a would connect to the load side. One way of connecting anode 12a and cathode 12c to the line is by attaching a conductor plate (shown in broken lines at 55 in FIG. 2) to terminals 38 and 40 and connecting a line cable to the plate. The connection of cathode 12c and anode 12a to the load can be via cables 58 attached to plates 16 and 22. Triggering signals would be supplied from appropriate triggering circuits via the gate-cathode lead wires across the gate-cathode terminals of the semi-conductors in appropriately timed relationship to relatively phase the conduction of each semi-conductor device in relation to the phase of the corresponding line.

While the foregoing description of the preferred embodiment describes a novel mounting arrangement for semi-conductor devices, the inventive principles may be applied to designs other than that specifically disclosed herein and the scope of the invention is to be measured by the following claims.

What is claimed is:

1. In a mounting arrangement for electronic semi-conductor devices, the combination comprising:
   a pair of electronic semi-conductor devices, each having a flat terminal surface, disposed with said flat terminal surfaces thereof facing each other;
   a pair of electrical conductor members disposed between said pair of devices, each member having a flat surface disposed against the flat terminal surface of a corresponding one of said devices;
   spacing means disposed between said members; and mounting means mounting said devices, said members and said spacing means including means applying a clamping force to hold said devices, said members and said spacing means together;
   said spacing means including a pivotal connection between said conductor members permitting said members to relatively position themselves in response to application of said clamping force and maintaining said flat surface of each member against said flat terminal surface of the corresponding one of said devices,
   said spacing means further including insulating means preventing current flow through said pivotal connection between said members.

2. The combination of claim 1 wherein said pivotal connection is provided by a spherical element.

3. The combination claim 2 wherein said spacing means further includes a spacer member containing a seat therein, said spherical element seating in said seat.

4. In a mounting arrangement for electronic semi-conductor devices, the combination comprising:
   a pair of electronic semi-conductor devices, each having a flat terminal surface, disposed with said flat terminal surfaces thereof facing each other;
   a pair of electrical conductor members disposed between said pair of devices, each member having a flat surface disposed against the flat terminal surface of a corresponding one of said devices;
   spacing means disposed between said members;
   and mounting means mounting said devices, said members and said spacing means including means applying a clamping force to hold said devices, said members and said spacing means together;
   said spacing means including a pivotal connection between said conductor member for permitting said members to relatively position themselves in response to application of said clamping force and maintaining said flat surface of each member against said flat terminal surface of the corresponding one of said devices, said pivotal connection being provided by a spherical element, said spacing means further including a spacer member containing a seat therein, said spherical element seating in said seat, and
   said spacing means further including an insulator element disposed between said spacer member and one of said conductor members.

5. In a mounting arrangement for electronic semi-conductor devices, the combination comprising:
   a pair of electronic semi-conductor devices, each having a flat terminal surface, disposed with said flat terminal surfaces thereof facing each other;
   a pair of electrical conductor members disposed between said pair of devices, each member having a flat surface disposed against the flat terminal surface of a corresponding one of said devices;
   spacing means disposed between said members;
   and mounting means mounting said devices, said members and said spacing means including means applying a clamping force to hold said devices, said members and said spacing means together;
   said spacing means including a pivotal connection between said conductor members for permitting said members to relatively position themselves in response to application of said clamping force and maintaining said flat surface of each member against said flat terminal surface of the corresponding one of said devices; and
   wherein said flat terminal surface of one of said semi-conductor devices is circular in shape and said spacing means includes a spacer member and an annular insulator element disposed in axial alignment with said circular surface, with said insulator element being disposed between said spacer member and the conductor member against which said circular surface is disposed.

6. The combination of claim 5 wherein said pivotal connection is provided by a spherical element seated on said spacer member.

7. In a mounting arrangement for electronic semiconductor devices, the combination comprising:
   a pair of electronic semi-conductor devices, each having a flat terminal surface, disposed with said flat terminal surfaces thereof facing each other;
   a pair of electrical conductor members disposed between said pair of devices, each member having a flat surface disposed against the flat terminal surface of a corresponding one of said devices;
   spacing means disposed between said members;
   and mounting means mounting said devices, said members and said spacing means including means applying a clamping force to hold said devices, said members and said spacing means together;
   said spacing means including a pivotal connection between said conductor members for permitting said members to relatively position themselves in response to application of said clamping force and maintaining said flat surface of each member against said flat terminal surface of the corresponding one of said devices; and
   wherein said spacing means comprises a pair of spacer members, a pair of annular insulator members each disposed between a corresponding one of said spacer members and the immediately adjacent conductor member and wherein said pivotal connection is provided by a spherical element seated between said two spacer members.

8. The combination of claim 7 including an additional pair of conductor members each cooperating with a corresponding one of said first-named pair of members to clamp the corresponding semi-conductor device.

9. A mounting arrangement for electronic semiconductor devices comprising:
   a rigid mounting panel containing a pair of apertures extending therethrough perpendicular to the plane of the panel;

a pair of rigid electrical conductor terminals, each extending through a corresponding one of said apertures and rigidly mounted on said panel, each terminal terminating in a flat contact surface on the same side panel with said flat contact surfaces of said terminals disposed in planes generally parallel with each other and perpendicular to the plane of said panel a pair of spaced conductor plates disposed in planes substantially parallel to each other and perpendicular to said panel;

mechanical fastening means attaching each plate to a corresponding one of said terminals against the flat contact surface thereof;

spacing means disposed between said plates including means providing for a limited pivotal displacement of said plates with respect to each other;

a pair of electronic semi-conductor devices, each being disposed on the side of a corresponding one of said plates opposite said spacing means and each having a flat terminal surface disposed against the corresponding plate; and means applying a clamping force to hold said devices, said plates and said spacing means together.

10. The mounting arrangement of claim 9 wherein said spacing means includes a spherical element providing said limited pivotal displacement.

11. The mounting arrangement of claim 10 wherein said spacing means includes a pair of spacer members each containing a seat, said spherical element being disposed in said seats between said spacer members.

12. A mounting arrangement for electronic semiconductor devices comprising:
a pair of electrical conductor terminals;
means mounting said terminals with their axes substantially parallel with each other;
a pair of spaced conductor plates disposed in planes substantially parallel to each other and to the axes of said terminals;
means attaching each plate to a corresponding one of said terminals;
spacing means disposed between said plates including means providing for a limited pivotal displacement of said plates with respect to each other;
a pair of electronic semi-conductor devices, each being disposed on the side of a corresponding one of said plates opposite said spacing means and each having a flat terminal surface disposed against the corresponding plate; and
means applying a clamping force to hold said devices, said plates and said spacing means together; wherein said spacing means includes a spherical element providing said limited pivotal displacement, and a pair of spacer members each containing a seat, said spherical element being disposed in said seats between said spacer members, and
a pair of insulating elements each disposed between a corresponding one of said spacer members and the adjacent conductor plate.

13. The combination of claim 12 wherein said insulating elements are annular in shape.

14. A mounting arrangement for electronic semiconductor devices comprises:
a rigid mounting panel containing a pair of apertures extending therethrough perpendicular to the plane of the panel;
a pair of rigid electrical conductor terminals, each extending through a corresponding one of said apertures and rigidly mounted on said panel, each terminal terminating in a flat contact surface on the same side of said panel with said flat contact surfaces of said terminals disposed in planes generally parallel with each other and perpendicular to the plane of said panel;
a stack of four spaced conductor plates disposed in planes perpendicular to said panel;
spacing means disposed between the two inner plates of the stack including means providing for a limited pivotal displacement between the two inner plates;
a pair of electronic semi-conductor devices each being disposed between and in electrical contact with a corresponding one of the two inner plates and the adjacent other plate;
mechanical fastening means attaching one of the two plates in electrical contact with each device to a corresponding one of said terminals against the flat contact surface thereof; and
means applying a clamping force to hold said devices, said plates and said spacing means together.

* * * * *